(12) United States Patent
Morita et al.

(10) Patent No.: US 6,509,854 B1
(45) Date of Patent: Jan. 21, 2003

(54) DA CONVERSION CIRCUIT

(75) Inventors: Motohiko Morita, Nagareyama (JP); Kenji Maio, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/554,185

(22) PCT Filed: Mar. 12, 1999

(86) PCT No.: PCT/JP99/01214
§ 371 (c)(1),
(2), (4) Date: May 11, 2000

(87) PCT Pub. No.: WO99/48210
PCT Pub. Date: Sep. 23, 1999

(30) Foreign Application Priority Data

Mar. 16, 1997 (JP) .......................................... 10-084927

(51) Int. Cl.$^7$ ................................................ H03M 1/66
(52) U.S. Cl. ....................................... 341/144; 341/143
(58) Field of Search ............................... 341/143, 136, 341/144, 153, 162; 340/347

(56) References Cited

U.S. PATENT DOCUMENTS 4,594,577 A * 6/1986 Mao ........................... 340/347
5,706,006 A * 1/1998 Hattori ....................... 341/144
6,084,254 A * 7/2000 Kim ........................... 257/134

FOREIGN PATENT DOCUMENTS

| JP | 63-198230 | 12/1988 |
| JP | 5-191290 | 7/1993 |
| JP | 6-120834 | 4/1994 |
| JP | 7-106971 | 4/1995 |

* cited by examiner

Primary Examiner—Peguy JeanPierre
Assistant Examiner—Joseph Lauture

(57) ABSTRACT

In a DA converter wherein an analog output voltage is formed in such a way that constant currents formed by a plurality of constant-current source transistors are selectively fed to a load resistor by controlling switching means to turn ON and OFF in correspondence with input signals; each of the constant-current source transistors is operated in an operating range from a saturation region to a non-saturation region as the output voltage enlarges in its absolute value, and those of the plurality of constant-current source transistors whose currents based on the operations in the non-saturation regions are selected by the switching means have their sizes enlarged so as to compensate for current decrements ascribable to such operations in the non-saturation regions.

17 Claims, 11 Drawing Sheets

(A)

(B)

(A)

(B)

(A)

(B)

(A)

(B)

DA CONVERSION CIRCUIT

BACKGROUND OF THE INVENTION

1. Field of the Invention

This invention relates to a DA (digital-to-analog) converter, and mainly to techniques which are effective when utilized for a DA converter of current addition type permitted to operate with a low supply voltage.

2. Description of the Prior Art

Examples of a DA converter of current addition type are stated in the official gazettes of Japanese Patent Applications Laid-open No. 191290/1993 and No. 120834/1994. In the current addition type DA converter, a transistor (MOSFET: metal oxide semiconductor field-effect transistor) for forming a constant current is operated in its saturation region so as to construct a constant-current source. Therefore, a required supply voltage is a comparatively large voltage which is obtained by adding a lower-limit voltage for operating the transistor in a non-saturated condition, to a maximum output voltage.

Moreover, the maximum output voltage (full-scale voltage) becomes a voltage produced when all the constant currents are added up and are caused to flow through a load resistor. It is influenced by discrepancy in the individual constant currents, and is difficult to be set at a desired voltage. In particular, when the DA converter is operated with a low supply voltage, currents in the individual constant-current source transistors are liable to decrease under the influence of an output voltage. Therefore, it becomes increasingly difficult to set the maximum output value at the desired voltage.

Accordingly, this invention has for its object to provide a DA converter which is permitted to operate with a low voltage. Another object of this invention is to provide a DA converter which facilitates the setting of its maximum output voltage. Still another object of this invention is to provide a DA converter which is permitted to operate with a low voltage, and which facilitates the setting of its maximum output voltage. The above and other objects and novel features of this invention will become apparent from the description of this specification when read in connection with the accompanying drawings.

SUMMARY OF THE INVENTION

A typical aspect of performance of this invention is briefly summarized as follows: In a DA converter wherein an analog output voltage is formed in such a way that constant currents formed by a plurality of constant-current source transistors are selectively fed to a load resistor by controlling switching means to turn ON and OFF in correspondence with input signals; each of the constant-current source transistors is operated in an operating range from a saturation region to a non-saturation region as the output voltage enlarges in its absolute value, and those of the plurality of constant-current source transistors whose currents based on the operations in the non-saturation regions are selected by the switching means have their sizes enlarged so as to compensate for current decrements ascribable to such operations in the non-saturation regions.

Another typical aspect of performance of this invention is briefly summarized as follows: A DA converter comprises a current mirror circuit which produces an analog output voltage in such a way that constant currents formed by a plurality of constant-current source transistors are selectively fed to a load resistor by controlling switching means to turn ON and OFF in correspondence with input signals, and a reference voltage generation unit which forms a constant voltage for forming the constant currents; the plurality of constant-current source transistors include ones which have weights of currents corresponding to binary digital signals of lower bit side among the input signals, and ones which have the same weight of currents in correspondence with digital signals obtained in such a way that binary digital signals of higher bit side among the input signals are decoded in the decimal notation; and a voltage formed in such a way that a current formed by a transistor, which is fabricated with the same size as that of each of the constant-current source transistors having the same current weight correspondent to the higher bit side and whose emitter (or source) and base (or gate) are respectively connected in common with those of the constant-current source transistors, is caused to flow through a resistance element endowed with a resistance being that multiple of a resistance of the load resistor which corresponds to the number of the constant-current source transistors correspondent to the higher bit side, and a reference voltage corresponding to a maximum output voltage to-be-set, are fed to the input ends of a differential amplifier circuit, whereby the currents to flow through the constant-current source transistors are controlled so as to equalize both the voltage across the resistance element and the reference voltage.

DESCRIPTION OF THE PREFERRED EMBODIMENTS

In order to elucidate this invention in more detail, it will be described in conjunction with the accompanying drawings.

Figure 1:
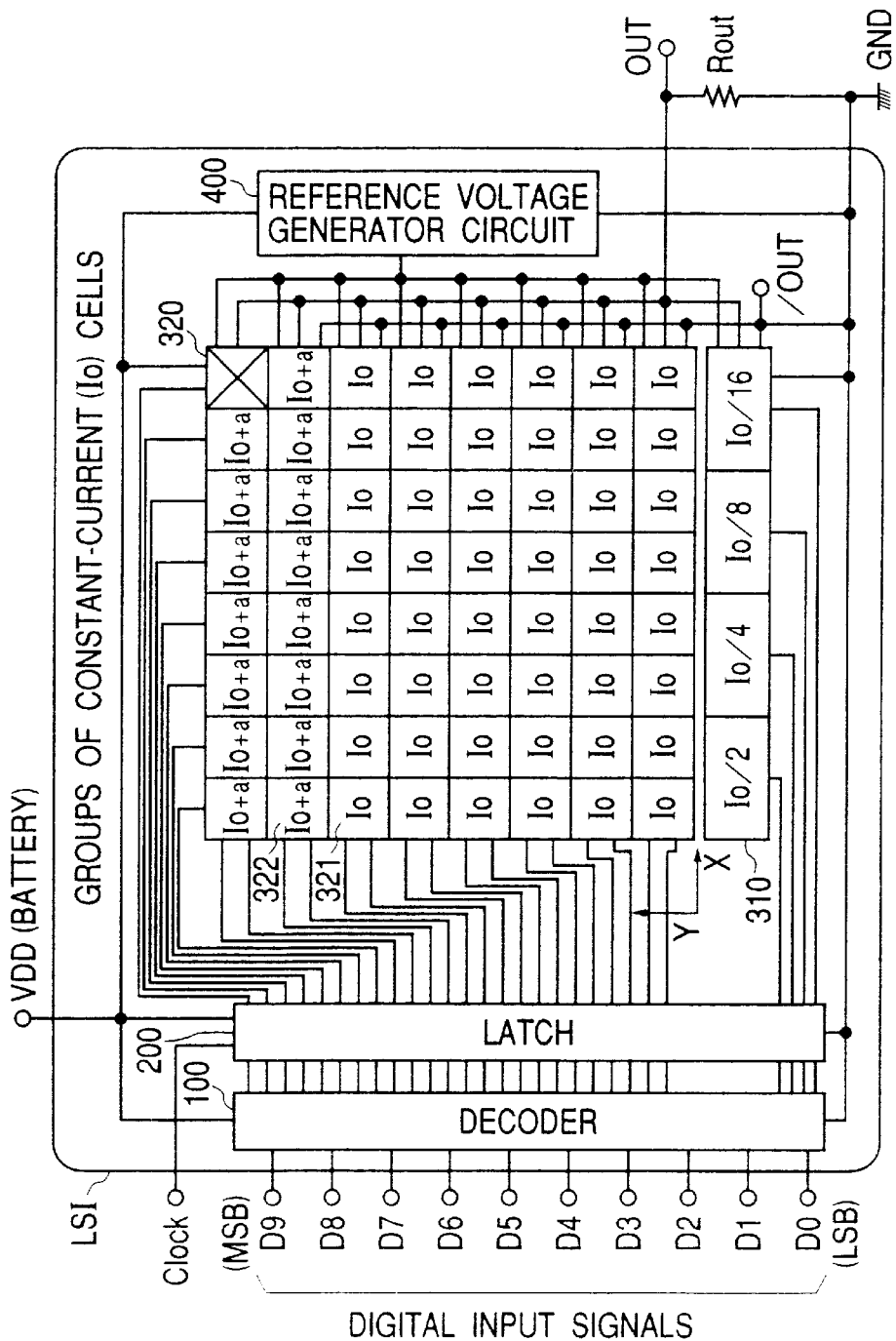
FIG. 1 is a schematic block diagram showing an embodiment of a DA converter according to this invention.

FIG. 1 illustrates a schematic block diagram of an embodiment of a DA converter according to this invention. Circuit blocks shown in the figure are fabricated on a single semiconductor substrate (LSI) such as of single-crystal silicon, on which they are packaged, by known manufacturing techniques for semiconductor integrated circuits.

The DA converter (hereinbelow, abbreviated to "DAC" in some cases) of this embodiment includes a decoder circuit 100 which receives binary digital input signals D0~D9, a latch circuit 200 which holds the decoded outputs of the decoder circuit 100 in association with a clock signal Clock, groups of constant-current cells 310 and 320, and a reference voltage generator circuit 400. Current regulation transistors which form constant currents, and switching transistors which are controlled to turn ON and OFF by selection signals held in the latch circuit 200, are included in the groups of constant-current cells 310 and 320.

The decoder circuit 100 allows the signals of the lower 4 bits D0~D3 among the binary digital signals D0~D9 to pass therethrough as they are, thereby to set them as the selection signals for the group of constant-current cells 310. Besides, the decoder circuit 100 decodes the remaining higher 6 bits D4~D9 among the digital signals D0~D9, thereby to form the selection signals which correspond to decimal numbers such as "0"~"63". In a case, not especially restrictive, where constant-current (Io) cells are arranged in the shape of a matrix (X, Y) of 8×8 as shown in the figure, the selection signals "1"~"63", are separated into signals of two directions in correspondence with the constant-current cells which are arrayed in an X direction and a Y direction as indicated in the figure. Thus, constant currents Io in the numbers of 1~63 are respectively selected in correspondence with the decoded results "1"~"63".

It is accordingly possible to form the 64 sorts of analog signals of 0~63 Io which correspond to the binary digital signals D4~D9. Besides, constant currents Io/2, Io/4, Io/8 and Io/16 which are respectively endowed with binary weights corresponding to the digital signals D3~D0 of the lower 4 bits are formed in the group of constant-current cells 310, and they are respectively selected in accordance with the digital signals D3~D0. Thus, analog signals with the 64 sorts of analog signals further decomposed in 16 stages can be formed. That is, analog currents of 64×16=1024 sorts can be formed.

Each of the constant-current cells (Io) and Io/2~Io/16 causes the corresponding current to flow to an output terminal /OUT when not selected, and to an output terminal OUT when selected, through the two switching transistors. That is, the output terminals /OUT and OUT are fed with the output currents which are in a complementary (opposite-phase) relationship. In this embodiment, the output terminal OUT is provided with a load resistor Rout, across which an analog output voltage is produced.

The reference voltage generator circuit 400 feeds a constant voltage to each of the constant-current cells (Io) and Io/2~Io/16, more concretely to the input terminal of each of the constant-current source transistors for forming the currents Io and Io/2~Io/16 as stated above. The constant-current source transistors are fabricated having size ratios which correspond to the magnitudes of the currents Io and Io/2~Io/16. By way of example, assuming that the transistor for forming the current Io/16 has a basic size, the current Io/8 is formed by connecting two such basic transistors in parallel, the current Io/4 by connecting four such basic transistors in parallel, the current Io/2 by connecting eight such basic transistors in parallel, and the current Io by connecting sixteen such basic transistors in parallel.

As another example, assuming that the transistor for forming the current Io/4 has a basic size, the current Io/16 may be formed by employing a transistor which has a size being ¼ of that of such a basic transistor, the current Io/2 by employing a transistor which has a size being ½ of that of such a basic transistor, the current Io/2 by connecting two such basic transistors in parallel, and the current Io by connecting four such basic transistors in parallel. In this manner, the word "size" is intended to mean an emitter area in a bipolar transistor, and a channel width in a MOSFET. That is, an expression "equal sizes" signifies that emitter areas are equal, or that channel widths are equal subject to the same channel length. An expression "½ size" signifies that an emitter area ratio is ½ of the basic emitter area, or that a channel width is ½ of the basic channel width subject to the same channel length.

In this embodiment, a supply voltage VDD which is fed to the decoder circuit 100, latch circuit 200, groups of constant-current cells 310, 320 and reference voltage generator circuit 400 is set at a comparatively low voltage which is formed by a battery or the like. By way of example, the low supply voltage VDD employed is such that the constant-current source transistor is operated extending over from its saturation region to its non-saturation region, by rise in the analog voltage derived from the output terminal OUT. Under such a supply voltage VDD, the constant-current source transistor comes to operate in the non-saturation region with the rise of the output voltage, and the constant current thereof on that occasion becomes smaller as compared with the constant current Io in the saturation region. In this embodiment, therefore, the constant-current cell as to which the current based on the operation in the non-saturation region is selected by the decoded output of the input digital signals has its size enlarged as shown by a cell 322, so as to compensate for a current decrement ascribable to the operation in the non-saturation region. That is, the cell 322 is fabricated with a somewhat larger size so that a somewhat larger current such as (Io+a) may be caused to flow in the intrinsic operation of the constant-current source transistor in the saturation region. On the other hand, a cell 321 is fabricated so as to form the current Io in the operation in the saturation region.

Figure 2:
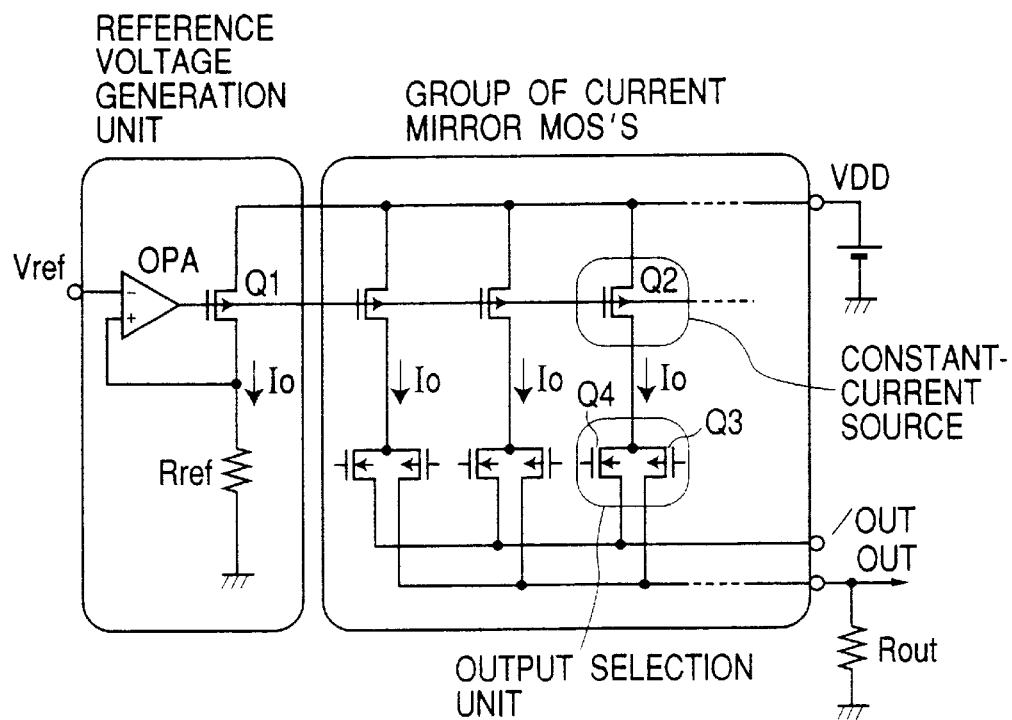
FIG. 2 is for explaining the DA converter according to this invention.
Figure 2:
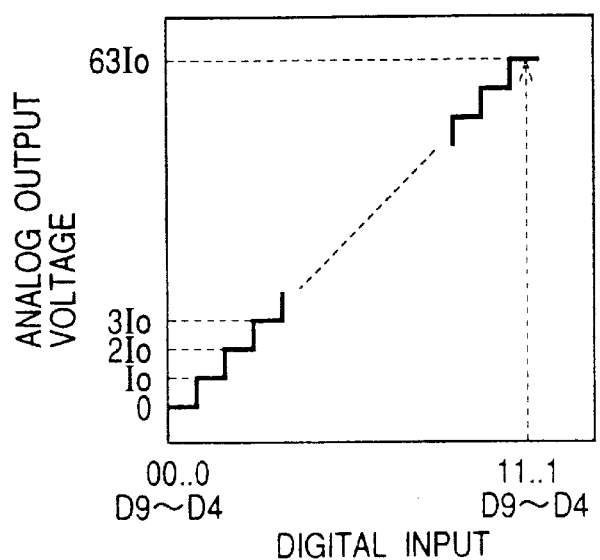

FIG. 2 is diagrams for explaining the DA converter according to this invention. Concretely, FIG. 2A illustrates an equivalent circuit for explaining the relationship between the group of constant-current cells 320 and the reference voltage generator circuit 400, while FIG. 2B illustrates the input-output characteristics of the equivalent circuit based on the group of constant-current cells 320.

Each of the 63 constant-current (Io) cells includes a MOSFET of P-channel type Q2 whose source is fed with the supply voltage VDD, whose gate has a constant voltage applied thereto, the constant voltage being formed by a reference voltage generation unit to be explained later, and which constructs a constant-current source, and a switching MOSFET of P-channel type Q3 and a switching MOSFET of N-channel type Q4 which construct an output selection unit. The P-channel MOSFET Q3 has its source-drain path connected between the constant-current source MOSFET Q2 and the output terminal OUT, while the N-channel MOSFET Q4 has its source-drain path connected between the constant-current source MOSFET Q2 and the output terminal /OUT. Thus, the constant current Io formed by the constant-current source MOSFET Q2 is fed to the output terminal /OUT or OUT through the corresponding one of the MOSFET's Q3 and Q4 which are complementarily controlled to turn ON and OFF by input signals (the selection signals stated before). The remaining 62 constant-current cells are operated similarly to the above. In FIG. 2A, three of the constant-current cells are representatively exemplified including the MOSFET's Q2~Q4.

Currents 0~63 Io flow to the output terminal OUT in correspondence with input signals from a minimum value in which the digital input signals D4~D9 of the higher 6 bits among those D0~D9 are "00 . . . 0" (all 0's), to a maximum value in which the digital input signals D4~D9 are "11 . . . 1" (all 1's). Therefore, the output terminal OUT can be fed with stepped analog output currents (of 64 steps) as shown in FIG. 2B. In addition to the stepped currents, analog currents not shown are formed in such a way that each of the steps is decomposed in 16 stages in correspondence with the digital signals D3~D0 of the lower 4 bits. The load resistor Rout is connected between the output terminal OUT and the ground potential of circuitry, and 1024 sorts of analog output voltages can be formed across the load resistor Rout in correspondence with the currents derived from the output terminal OUT. Assuming by way of example that the maximum value of the output voltage is 1 [V], the analog output voltages can be produced at a resolution of about 1 [mV].

In this embodiment, the reference voltage generation unit as stated below is employed so that the maximum value (full-scale voltage) of the output voltage can be precisely set at a desired voltage. The source and gate of a constant-current source MOSFET Q1 having the same structure as that of the constant-current source MOSFET Q2 are respectively connected in common to the sources and gates of the constant-current source MOSFET's Q2, etc. A reference resistor Rref is connected between the drain of the MOSFET Q1 and the ground potential of the circuitry. The reference resistor Rref is endowed with a resistance being that multiple of the resistance of the load resistor Rout which corresponds to the number of the current mirror MOSFET's of the constant-current source MOSFET's Q2, etc. Concretely, Rout×63=Rref holds in the DAC of 6 bits employing the 63 constant-current source MOSFET's as stated before, and Rout×(64−1/16)=Rref holds in the DAC of 10 bits.

In the case where the constant-current source is constructed of the P-channel MOSFET as explained above, a voltage generated across the reference resistor Rref is fed to the non-inverting input end of a differential amplifier (or operational amplifier) circuit OPA so as to construct a negative feedback circuit between the differential amplifier circuit OPA and the MOSFET Q1. The inverting input end of the differential amplifier circuit OPA is fed with a reference voltage Vref corresponding to the maximum value of the output voltage. Thus, the current Io flowing through the MOSFET Q1 controls the gate voltage of this MOSFET Q1 so that the voltage drop across the reference resistor Rref may match with the reference voltage Vref. By way of example, subject to Vref>Rref×Io, the output voltage of the differential amplifier circuit OPA lowers to make the source-gate voltage of the MOSFET Q1 larger and to increase the constant current Io. In contrast, subject to Vref<Rref×Io, the output voltage of the differential amplifier circuit OPA rises to make the source-gate voltage of the MOSFET Q1 smaller and to decrease the constant current Io. In this way, a control is performed so as to establish Vref=Rref×Io.

The same constant current Io as that of the MOSFET Q1 flows through each of the constant-current MOSFET's Q2 in the group of current mirror MOSFET's, and the constant-current MOSFET's Q2 are disposed in the number of 63. Accordingly, when all the constant currents flow to the output terminal OUT, the output voltage produced across the load resistor Rout becomes Rout×63 Io, and the output voltage Vout in the full-scale mode is set equal to the reference voltage Vref in view of the relation of Rout×63= Rref.

Figure 3:
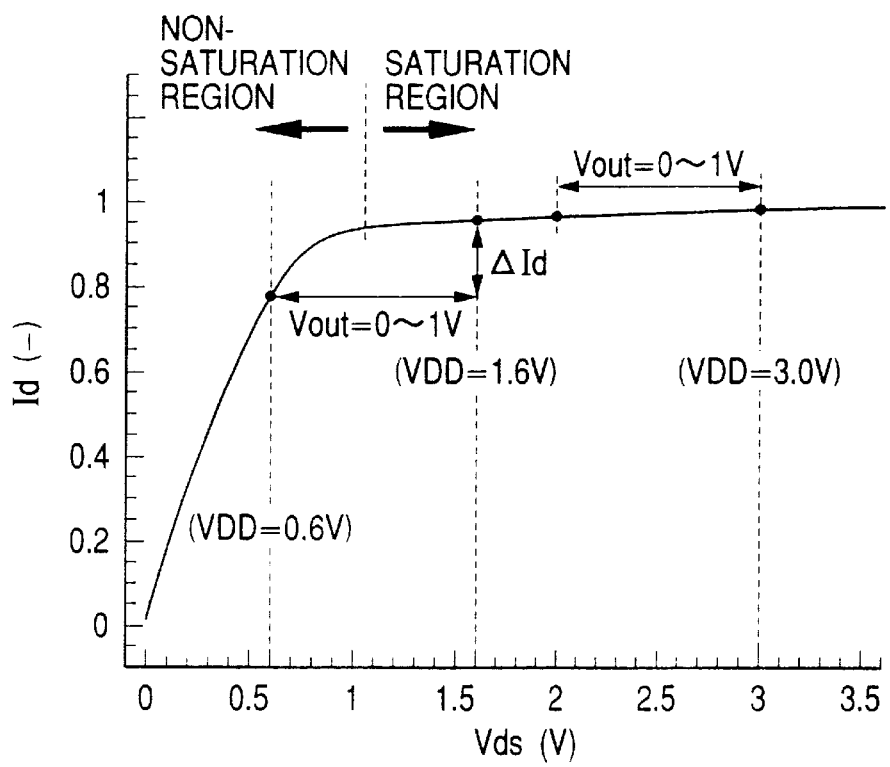
FIG. 3 is a graph of the voltage-current characteristics of the constant-current source MOSFET for explaining this invention.

FIG. 3 illustrates a graph of the voltage-current characteristics of the constant-current source MOSFET for explaining this invention. In the figure, the axis of abscissas represents the drain-source voltage Vds of the MOSFET, while the axis of ordinates represents the drain current Id of the MOSFET. In, for example, a DA converter for image processing, a signal amplitude such as of 1 [V] is required at its maximum. That is, a voltage such as of 1 [V] is required as the output voltage in the full-scale mode as explained before.

In case of operating the DA converter with a comparatively large supply voltage VDD such as of about 3 [V], a voltage obtained by subtracting the analog output voltage Vout from the supply voltage VDD is applied between the source and drain of the constant-current source MOSFET. Here, a voltage loss in the output selection unit shall be ignored. When the supply voltage VDD is comparatively large in this manner, the constant-current source MOSFET can be operated in its saturation region. Accordingly, the drain current Id depends little upon the source-gate voltage of the MOSFET, and the output current Io is stable. The prior-art DA converter of current addition type is premised on such an operation in the saturation region. More specifically, in the prior-art DA converter, the constant-current source MOSFET is operated in the saturation region, and hence, a voltage of about 1.1 [V] needs to be ensured as the source-drain voltage of the constant-current source MOSFET. Therefore, a comparatively high voltage such as of, at least, 2.1 [V] is inevitably required as an operating voltage.

In a DA converter to be mounted in a portable electronic apparatus which is driven by a battery, it is required to realize an operation with a low voltage for the purpose of prolonging the lifetime of the battery. The inventors have therefore thought out to use the constant-current source MOSFET in a range expanded to the non-saturation region thereof, while breaking through common knowledge in the prior art. In the case where the constant-current source MOSFET is operated by expanding the operating range to the non-saturation region in this manner, the supply voltage VDD can be set at a low voltage such as of 1.6 [V] as indicated in the figure. Concretely, subject to such a supply voltage VDD, when the output voltage Vout is set at the maximum value such as of 1 [V], the source-drain voltage Vds of the constant-current source MOSFET lowers down to 0.6 [V], and this MOSFET comes to operate in the non-saturation region.

Figure 4:
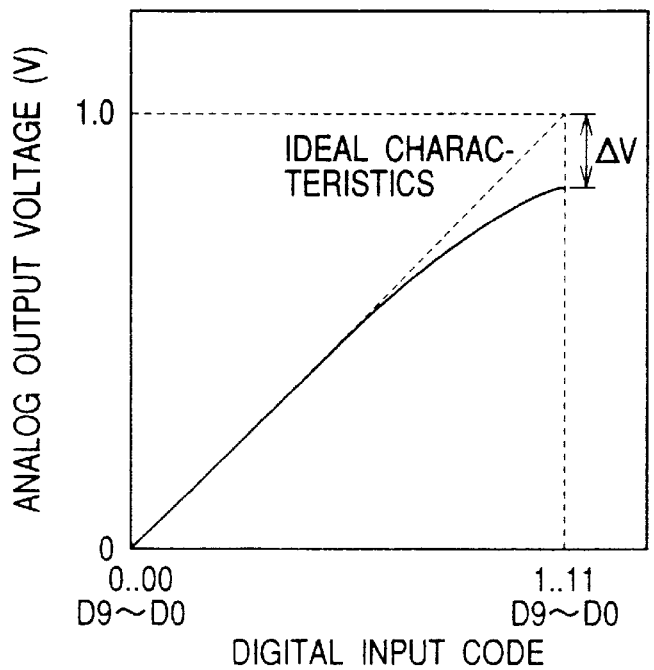
FIG. 4 is a graph of the input-output characteristics of the DA converter for explaining a linearity error and a full-scale error in this invention.

As a result, when the constant-current source MOSFET is operated even in the non-saturation region in the prior-art DA converter, the drain current Id thereof decreases as shown in FIG. 4 under the influence of the source-drain voltage Vds thereof with the rise of the analog output voltage. Therefore, a linearity error and a full-scale error ΔV increase with respect to ideal characteristics as indicated by broken lines in the figure.

Figure 5:
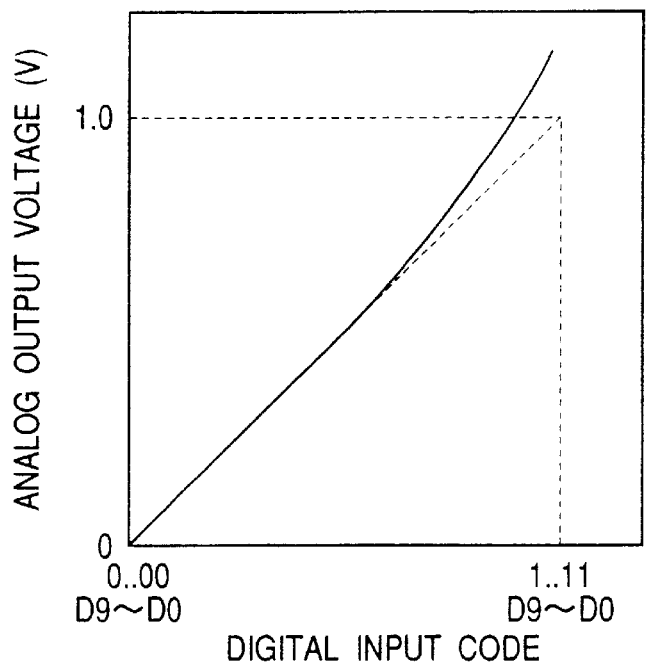
FIG. 5 is a graph of the input-output characteristics of the DA converter for explaining the principle of error corrections in this invention.
Figure 6:
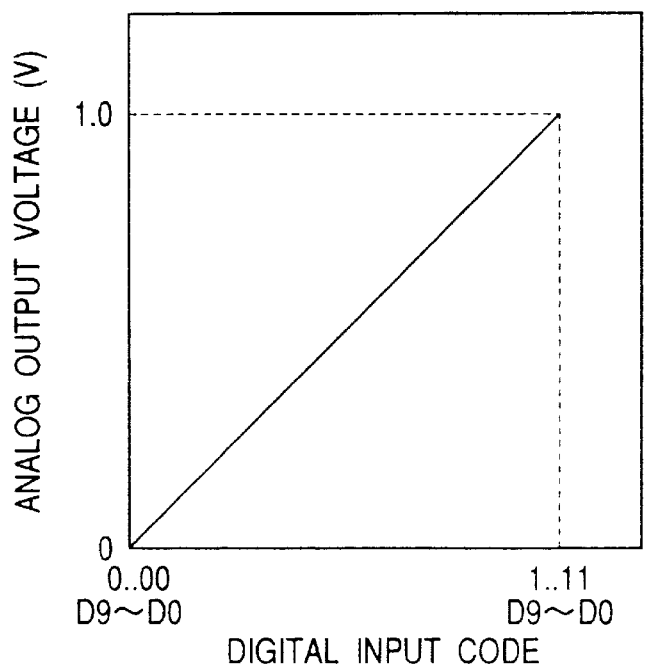
FIG. 6 is a graph of the input-output characteristics of the DA converter according to this invention.

According to this invention, in order to correct the linearity error and full-scale error ΔV, the constant-current source cell is constructed so as to exhibit input-output characteristics as shown in FIG. 5, during the operation in the saturation region. That is, the constant-current source MOSFET is fabricated by enlarging its size beforehand so as to compensate for the linearity error and full-scale error shown in FIG. 4. In a case where the larger-sized constant-current source MOSFET is fabricated beforehand and where it is used for a DA conversion operation even in the non-saturation region as shown in FIG. 3, the drain current Id decreases under the influence of the decrease of the source-drain voltage Vds in such a non-saturation region, and it approximates the ideal characteristics indicated by broken lines in FIG. 5. In other words, the constant-current source cell (at numeral 322 in FIG. 1) whose input-output characteristics in the saturation region are as shown in FIG. 5 is employed, and it is used even in the non-saturation region as shown in FIG. 4, whereby input-output characteristics being substantially ideal characteristics as shown in FIG. 6 are attained by the synthesis of both the characteristics.

As a result, the DA converter according to this invention is permitted to operate with the low voltage as stated above, but the operating voltage range thereof narrows. More specifically, the constant-current source MOSFET is fabricated with the somewhat larger size beforehand in order to cope with the situation where it is operated in the non-saturation region with the rise of the output voltage. Accordingly, it must be considered that, when the operating voltage is set larger than the output voltage, a current such as a constant current Io+a in the cell 322 is caused to flow by the constant-current source MOSFET formed somewhat larger in size, so a plus error voltage ΔV is incurred relative to the full-scale voltage with the rise of the output voltage as shown in FIG. 5.

Such a narrow range of the operating voltage does not pose a considerable problem in the electronic apparatus in which the DA converter of this invention is employed. The reason therefor is that the supply voltage is a battery voltage, the values of which are limited within a predetermined narrow voltage range. Herein, when the battery voltage is set at or near a usable lower-limit voltage by employing a suitable voltage regulation circuit as is included in an ordinary electronic apparatus, the supply voltage of the DA converter can be restricted to the operation with the predetermined voltage for which the operation in the non-saturation region is considered.

Figure 7:
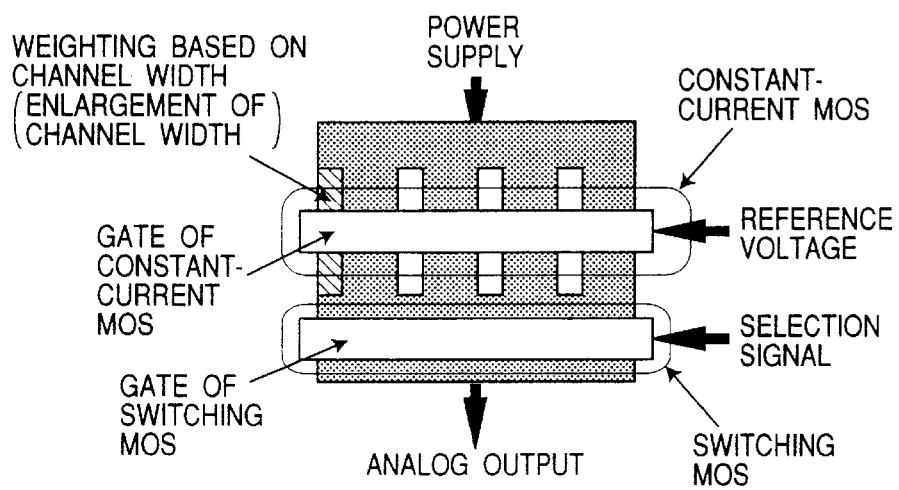
FIG. 7 is layout diagrams of a constant-current source MOSFET for use in the DA converter according to this invention.
Figure 7:
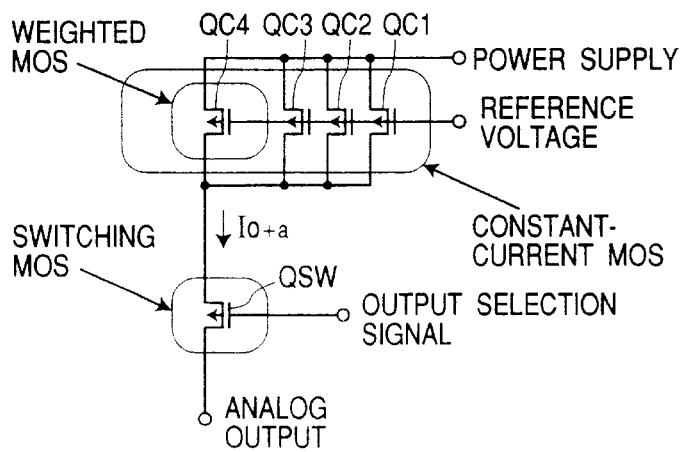

FIG. 7 is layout diagrams of a constant-current source MOSFET for use in the DA converter according to this invention. Concretely, FIG. 7A illustrates the element pattern of the constant-current source MOSFET, while FIG. 7B illustrates the equivalent circuit of MOSFET elements. By way of example, one constant-current source MOSFET is so constructed that four MOSFET's (QC1, QC2, QC3, QC4) are connected in parallel. More specifically, the MOSFET for forming the current Io/4 is designed as a basic structure, and four such MOSFET's are connected in parallel, whereby the constant-current source cell 321 for forming the constant current Io is constructed. In this case, the source regions (terminals) of the four MOSFET's are formed (coupled) in common with (to) a diffusion layer extending from a power supply, while the drain regions (terminals) of these MOSFET's are formed (coupled) in common with (to) a source diffusion layer constructing a switching MOSFET (QSW).

That is, the source and drain of the constant-current source MOSFET is fabricated of the four MOSFET's each having the same channel width as the source and drain of the reference MOSFET for forming the current Io/4.

Meanwhile, in the constant-current source MOSFET (in the constant-current source cell 322) whose output current is selected in the operation in the non-saturation region as explained before, the leftmost one (QC4) of the four MOSFET's is weighted on the basis of a channel width. That is, it is fabricated with a larger channel width (as channel width enlargement) in order that a current component "+a" may be caused to flow so as to compensate for the decrease of the output current Io. Assuming that the constant-current source MOSFET of the larger channel width (somewhat larger size) is operated in the saturation region, it causes the constant current Io+a to flow as shown by the equivalent circuit in FIG. 7.

In FIG. 7, the switching MOSFET of N-channel type for causing the current to flow to the inverting output terminal /OUT is omitted from illustration. The N-channel switching MOSFET is fabricated in a P-type well region in order to electrically isolate it, if the above constant-current source MOSFET and switching MOSFET of P-channel type are formed on an N-type substrate by way of example. To the contrary, the N-channel switching MOSFET is fabricated on a P-type semiconductor substrate, if the P-channel MOSFET's are formed in an N-type well region formed on the P-type substrate. Although no specially restriction is intended, the connection of such an N-channel switching MOSFET may be so done that a contact hole is provided in the source region of the P-channel switching MOSFET, whereupon this source region is connected to the drain of the N-channel switching MOSFET by a wiring layer.

Figure 8:
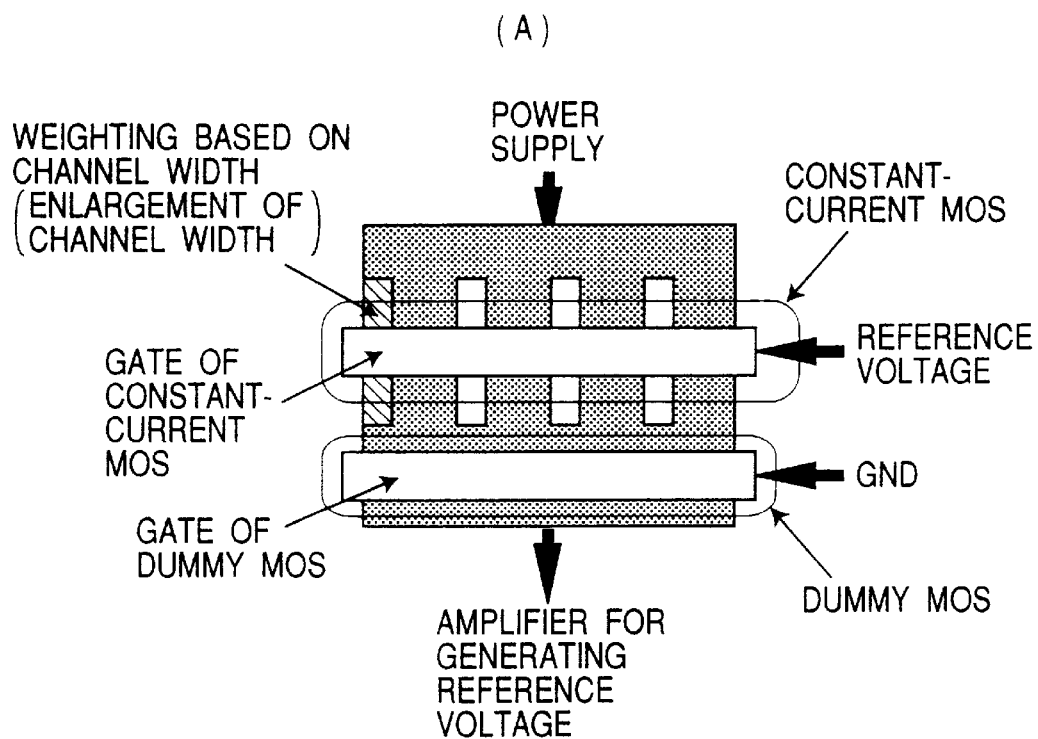
FIG. 8 is layout diagrams of a constant-current source MOSFET for use in the reference voltage generator circuit of the DA converter according to this invention.
Figure 8:
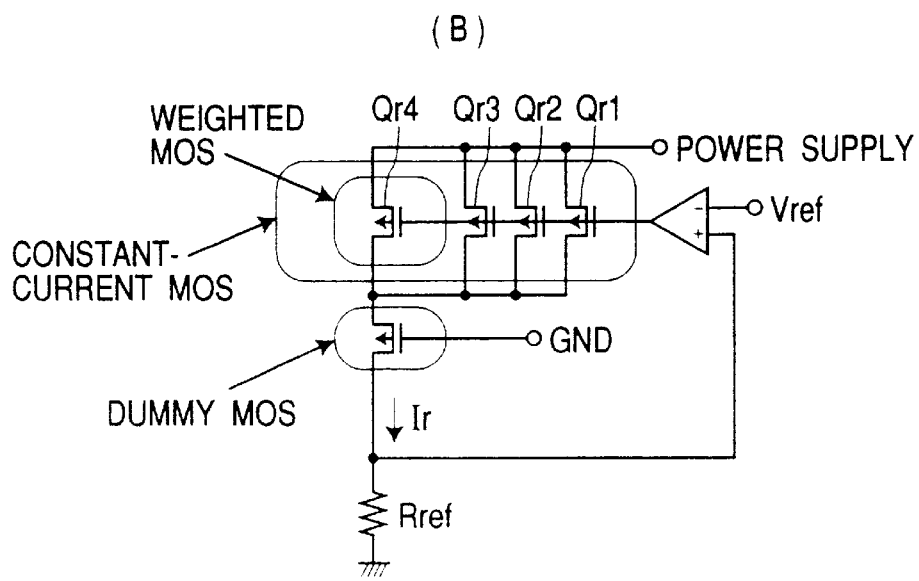

FIG. 8 is layout diagrams of a constant-current source MOSFET for use in the reference voltage generator circuit of the DA converter according to this invention. Concretely, FIG. 8A illustrates the element pattern of the constant-current source MOSFET, while FIG. 8B illustrates the equivalent circuit of MOSFET elements. As shown in FIG. 2, the MOSFET Q1 of the reference voltage generation unit has the same structure as that of the constant-current source MOSFET Q2. Accordingly, in the case of operating the constant-current source MOSFET even in the non-saturation region as explained before, the leftmost one (Qc4) is weighted on the basis of a channel width, that is, it is fabricated with a larger channel width (as channel width enlargement) in order that a current component "+a" (a constant current Ir to be explained below) may be caused to flow so as to compensate for the decrease of the output current Io.

As shown in FIG. 8B, the reference resistor Rref as stated before is connected to the constant-current MOSFET including the weighted constituent MOSFET, through a dummy MOSFET corresponding to the switching MOSFET. Besides, a voltage formed by the reference resistor Rref and the current Ir flowing therethrough is compared by a differential amplifier circuit with the reference voltage Vref corresponding to the maximum output voltage. Thus, the constant voltage to be fed to the gates of the constant-current MOSFET's is generated so that both the voltages may match with each other.

According to this construction, in the example of the DA converter as shown in FIG. 1, the ratio between the resistances of the reference resistor Rref and the load resistor Rout is set at 63:1, whereby the current Ir to flow to the constant-current MOSFET's on the occasion of the maximum voltage output can be controlled so as to become the constant current Io. More specifically, the constant current Ir is set at the average value of the currents flowing through the constant-current source cells in the full-scale mode, in other words, the ratio between the resistances of the resistors Rref and Rout is set at 63:1 in conformity with Ir=[48 Io+15 (Io+a)]63 in the example of FIG. 1, whereby the full-scale analog output voltage can be set equal to the reference voltage Vref. Moreover, since a voltage loss component in the selection unit disposed in the constant-current source cell is also cancelled by providing the dummy MOSFET, the full-scale error can be substantially zeroized.

Figure 9:
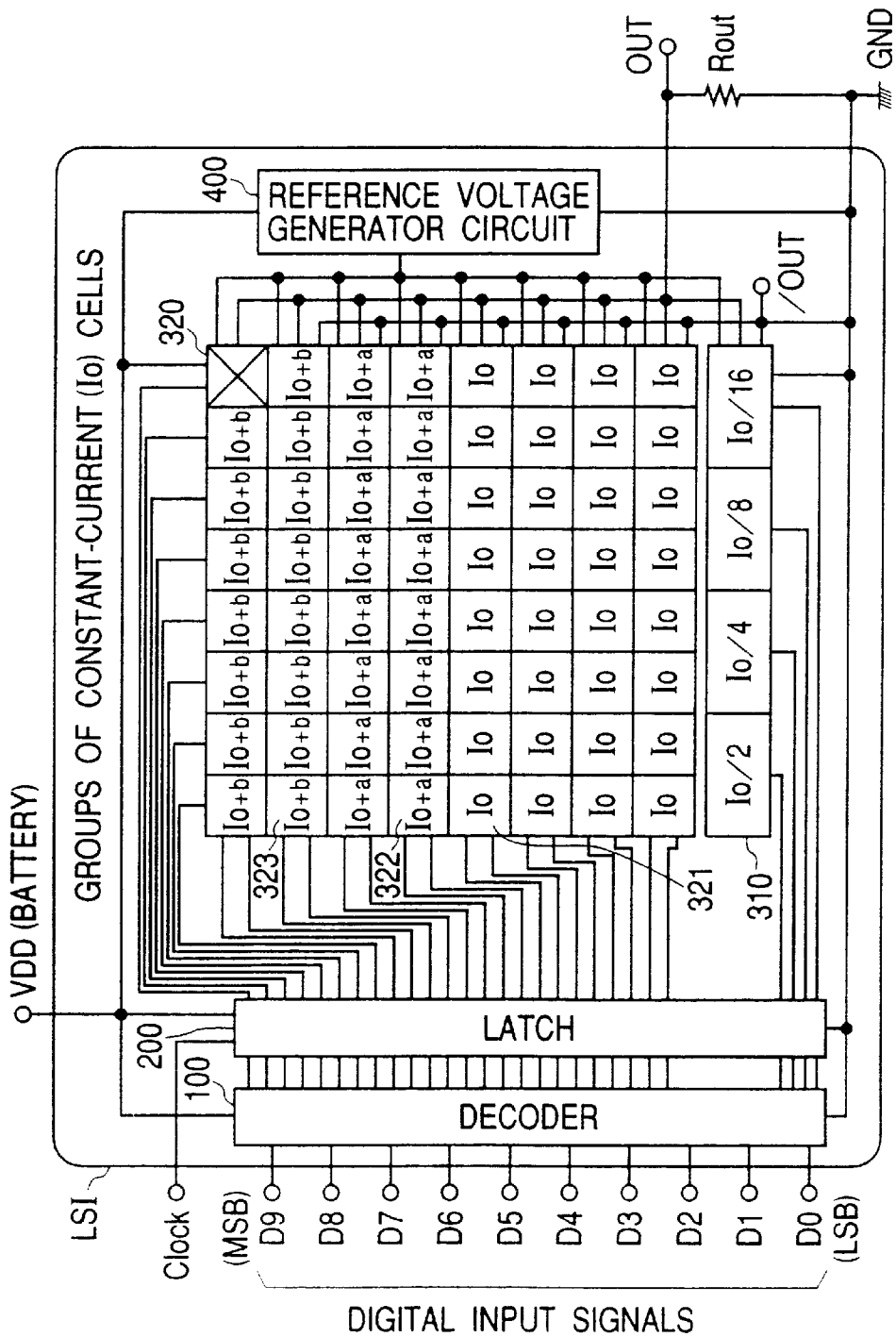
FIG. 9 is a schematic block diagram showing another embodiment of the DA converter according to this invention.

FIG. 9 illustrates a schematic block diagram of another embodiment of the DA converter according to this invention. In the DA converter of this embodiment, groups of constant-current source cells 320 include three kinds of cells 321, 322 and 323. Assuming by way of example that the constant-current MOSFET's begin to operate in the non-saturation regions at or near the mid-point voltage of the output signal as in the input-output characteristics shown in FIG. 4, the constant-current source cells are classified into halves, and the cells of one half within a range of Nos. 1 thru 32, which operate in the saturation regions, are constructed as basic cells as indicated at numeral 321. The other half is further classified into halves (quarters of all the cells), and corrections of comparatively small current such as Io+a are made in the cells 322 within a range of Nos. 33 thru 48, while corrections of comparatively large current such as Io+b are made in the remaining cells 323 within a range of Nos. 49 thru 63. That is, the correction currents are set so as to hold b>a. In other words, a weight based on a channel width is set small for the corrections a, while a weight based on the channel width is set large for the corrections b.

The corrections of the errors of linearity can be performed at a higher precision by setting such current weights in the constant-current source cells. In the groups of cells arranged in the shape of, for example, a matrix, the weights based on the channel width may well be made different in column units in accordance with the idea as explained above. Further, in order to achieve the highest correction precision, weights based on the channel width may well be respectively set for the individual constant-current source MOSFET's in correspondence with the magnitudes of digital signals to be inputted, in other words, the numbers of the constant-current source MOSFET's to be selected.

Figure 10:
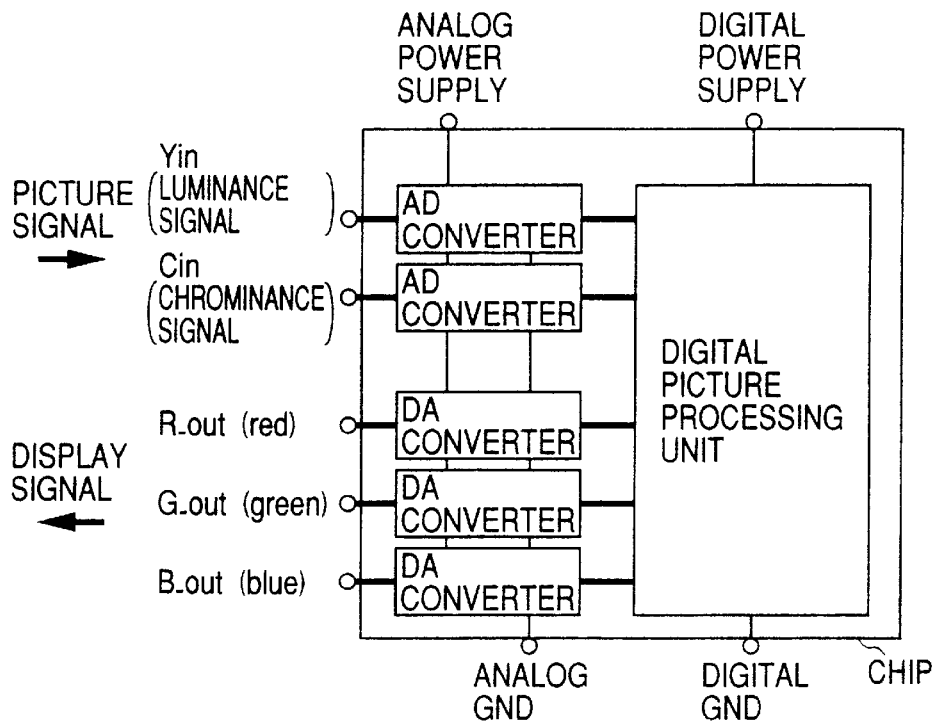
FIG. 10 is a block diagram showing an embodiment of the chip of a semiconductor integrated circuit in which the DA converters according to this invention are employed.

FIG. 10 illustrates a block diagram of an embodiment of a semiconductor integrated circuit device CHIP in which the DA converters according to this invention are employed. Although not especially restricted, the semiconductor integrated circuit device CHIP of this embodiment is so constructed and operated that a picture signal (Yin:luminance signal, Cin:chrominance signal) such as color video signal are received, that the signals Yin and Cin are respectively converted by AD (analog-to-digital) converters into digital signals, which are subjected to predetermined image processing in a digital image processing unit, and the processed results are converted into an analog display signal in the three primary colors of R (red), G (green) and B (blue) by the DA converters according to this invention, thereby to drive a color display device which employs, for example, a liquid crystal display (LCD). In such an image processing circuit, each of the DA converters is capable of operating with a low voltage as explained before, and hence, it is advantageous for a battery-driven portable electronic system which is constructed unitarily with the display device such as LCD.

In the semiconductor integrated circuit device CHIP, the digital circuits and analog circuits are mounted in coexistence, so that supply voltages and ground potentials are fed from different power supply terminals to the analog circuits and the digital circuits. This measure is taken for the reason that, since a signal is sometimes transferred with a full amplitude such as of the supply voltage in the digital circuit, switching noise of large amplitude which develops in a power supply line in forming the output signal of such signal amplitude is prevented from leaking to the side of the analog circuit through the power supply line.

Figure 11:
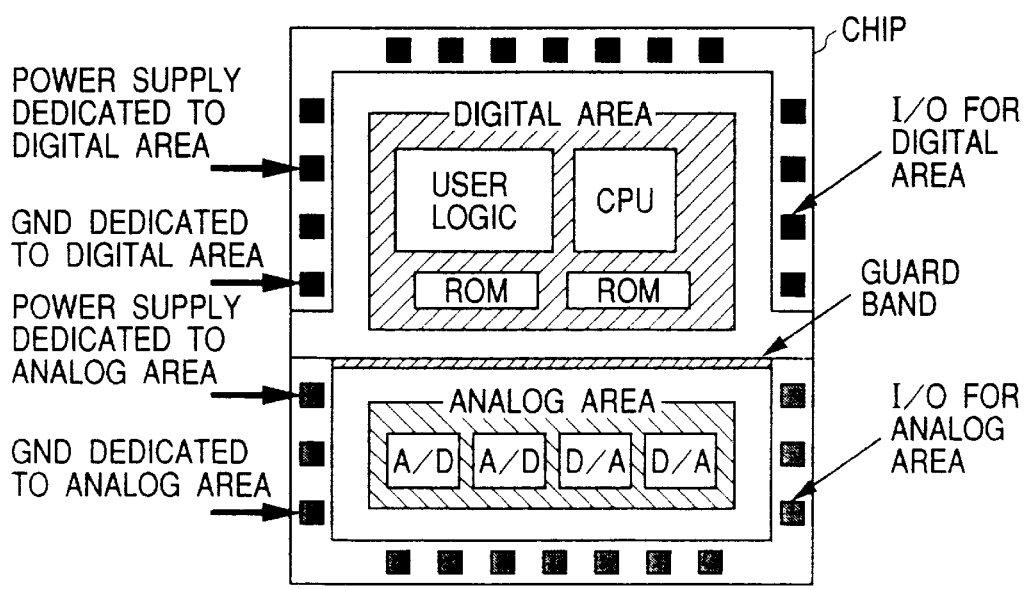
FIG. 11 is a schematic layout diagram showing an embodiment of the semiconductor integrated circuit shown in FIG. 10.

FIG. 11 illustrates a schematic layout diagram of an embodiment of the semiconductor integrated circuit device CHIP shown in FIG. 10. In the semiconductor integrated circuit device CHIP in which the analog circuits and the digital circuits coexist as explained above, a semiconductor chip is split into an analog circuit side and a digital circuit side, and a guard ring (guard band) is formed between both the sides on a semiconductor substrate, thereby to absorb noise components which leak from the digital circuit side to the analog circuit side through the substrate. Besides, as in the embodiment shown in FIG. 10, dedicated power supply terminals (pads) are provided independently of each other for the analog circuits and the digital circuits and are electrically isolated from each other, thereby to chiefly prevent various kinds of noise in the digital circuits from mixing into the analog circuits.

Figure 12:
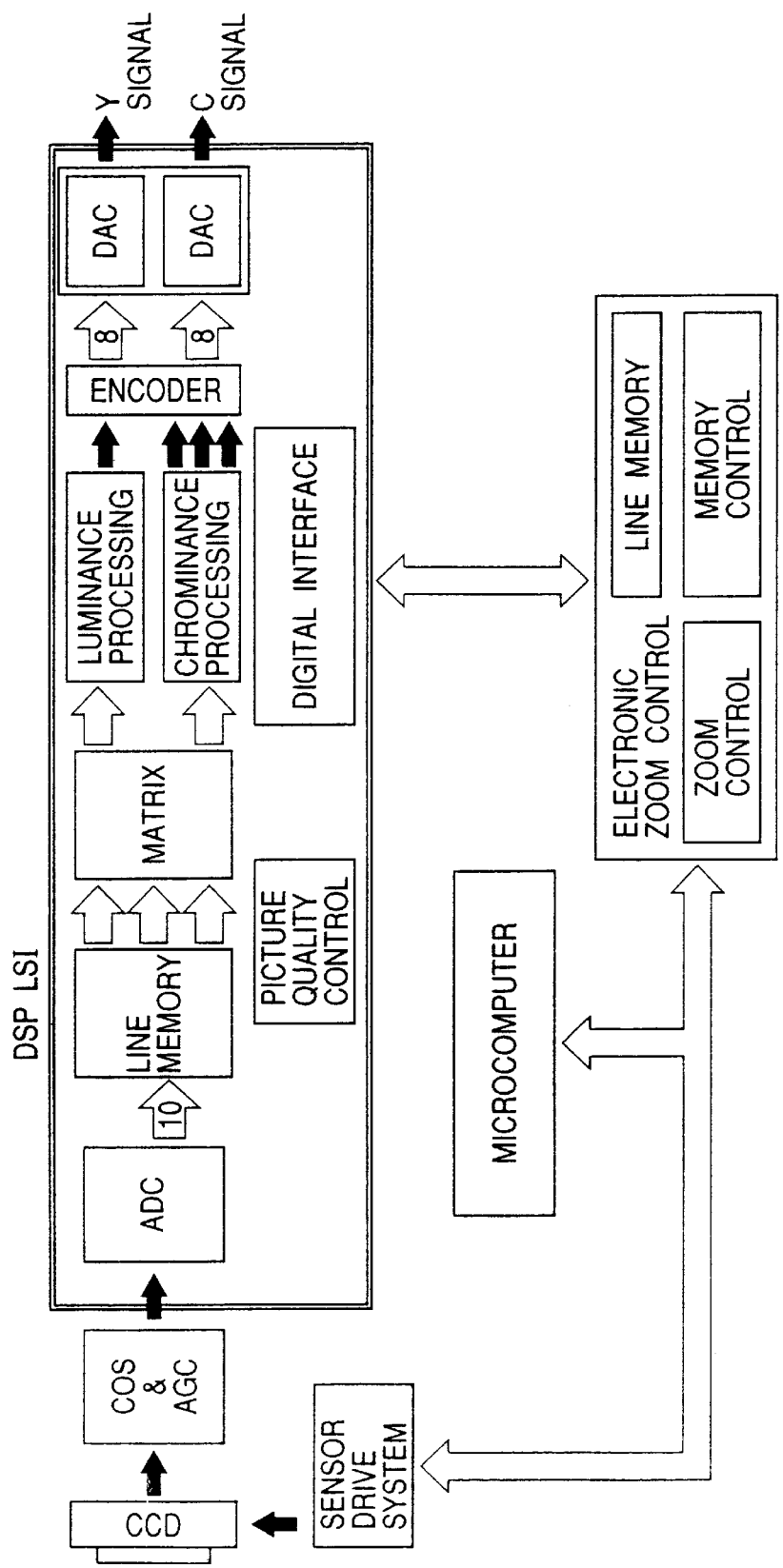
FIG. 12 is a block diagram showing an embodiment of an electronic apparatus in which the DA converters according to this invention are employed.

FIG. 12 illustrates a block diagram of an embodiment of an electronic apparatus in which the DA converters according to this invention are employed. This embodiment is directed toward an image pickup device for use in a VTR (video tape recorder) of the type having a camera incorporated, etc. A picture signal subjected to photoelectric conversion by a solid-state imaging element (charge-coupled device) CCD is received into a digital signal processor DSP constructed of a semiconductor integrated circuit device LSI, through a correlation double sampling circuit CDS and automatic gain control circuit AGC. In the signal processor DSP, the analog signal is converted into a digital signal by an ADC (analog-to-digital converter), and the digital signal is subjected to digital signal processing which includes the control of a picture quality and the formation of a Y (luminance) signal and a C (chrominance) signal for recording. The digital signal processing is executed by a line memory, a matrix circuit, a luminance processor, a chrominance processor and an encoder, and the Y (luminance) signal and C (chrominance) signal are formed by the analog conversions of the DAC's (digital-to-analog converters) according to this invention as explained before.

The DSP is provided with a digital interface, which delivers an enlarged digital picture signal fed from an electronic zoom control unit. The electronic zoom control unit includes a line memory, a memory control and a zoom control. A picture signal received through the digital interface is once stored in the line memory, and the part of the received picture signal to be enlarged is derived and is sent to the DSP through the digital interface so as to output the signal corresponding to the enlarged picture. The CCD is fed with a drive signal by a sensor drive system. A microcomputer forms control signals for controlling the sensor drive system and the electronic zoom control unit. In the image pickup device as stated above, the DAC's are capable of operating with a low voltage. It is therefore possible to prolong the lifetime of the battery of the battery-driven image pickup device, and to promote making the battery smaller in size and lighter in weight.

Figure 13:
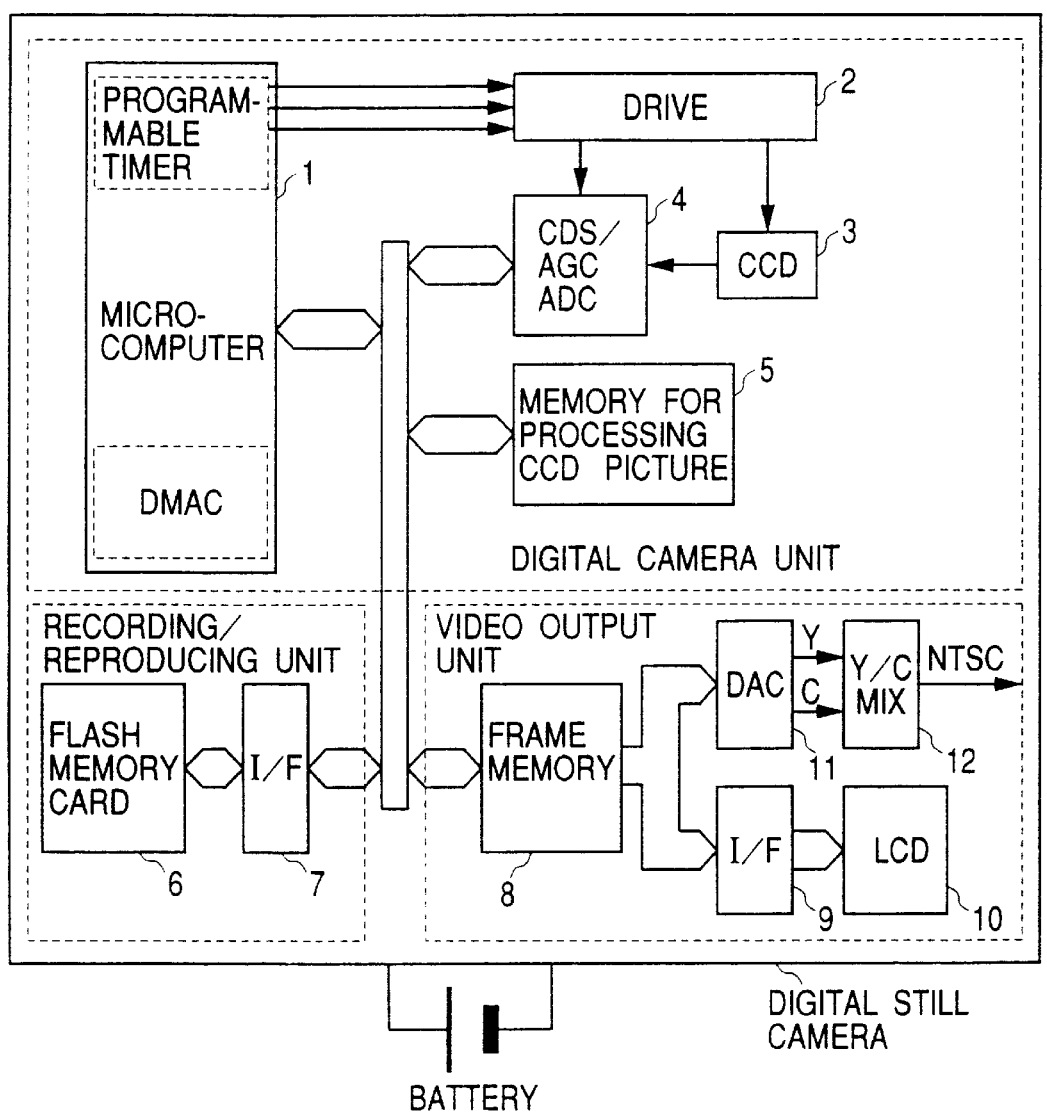
FIG. 13 is a block diagram showing an embodiment of a digital still camera which employs the DA converter according to this invention.

FIG. 13 is a block diagram of an embodiment of a digital still camera which employs a DA converter according to this invention. In the figure, only portions concerning electric signals are shown, and a lens mechanism and a mechanical mechanism including a switch etc. are omitted from illustration. The digital still camera of this embodiment is broadly divided into a digital camera unit, a recording/reproducing unit and a video output unit.

The digital camera unit includes a microcomputer (microprocessor) of single chip 1 which has a programmable timer and a direct memory access controller DMAC, a CCD 3, a drive circuit 2, a signal processing circuit 4 which executes video signal processing and the operation of conversion into digital signals, and a memory 5. The CCD 3 converts the optical image of a subject entered through an unshown imaging lens, into electric signals which are outputted in time series. The output signal of the CCD 3 has the reset noise of the CCD 3 removed and the source follower noise thereof reduced by a correlation double sampling circuit CDS included in the signal processing circuit 4, and it is subjected to a level control by an automatic gain control circuit AGC included in the same 4. The resulting signal is converted into the digital signal by an analog-to-digital converter ADC included in the circuit 4.

As is known, the CCD 3 is such that photoelectric transducers (photodiodes) are arranged in the shape of a matrix, and that photoelectrons created are delivered in time series through charge coupled devices for vertical transfer and charge coupled devices for horizontal transfer. The CCD 3 is one designed for the digital still camera, and data are read out therefrom in a non-interlaced mode. The drive circuit 2 forms clock signals for transferring various signals necessary for the above operations of the CCD 3, a timing signal for setting a sensitivity, and so on. That is, the drive circuit 2 receives timing signals delivered from the programmable timer of the microcomputer 1 and a reference clock signal formed by a reference frequency oscillator circuit disposed in the microcomputer 1, and it generates various timing signals for driving the CCD 3.

Although no special restriction is made, this embodiment is basically different in the driving method of the CCD 3 from a digital still camera in the prior art. More specifically, in the prior-art digital still camera, as many video signals as 30 frames per second, for example, are previously formed by bringing a CCD into correspondence with the display timings of a display device in the same way as in a digital VTR of the type having a camera incorporated, and a single frame of picture signal among the video signals, for which a shutter switch has been depressed, is stored in a memory. Therefore, the video signals except the single frame of picture signal corresponding to the timing of the shutter switch are, so to speak, drained away. It is quite wasteful to execute the same signal processing as that of picture data to-be-recorded for such picture data to-be-drained.

In this embodiment, necessary data processing is executed for only the picture data to-be-recorded, whereby the burden of the image processing operation is sharply relieved. As a result, an image processing LSI (digital signal processor DSP) as employed in the prior-art digital still camera can be dispensed with by, for example, a signal processing operation based on software in the microcomputer as will be explained below.

The DMAC mounted in the microcomputer 1 operates to store in the memory 5 those digital signals of single frame which correspond to the timing of the depression of the shutter switch. More specifically, the DMAC acquires a bus mastership instead of the central processing unit CPU of the microcomputer 1, and it generates control signals which instruct the address signals of the memory 5 and write operations therefor, in correspondence with the outputs of the analog-to-digital converter ADC included in the signal processing circuit 4. Thus, the digital signals outputted in time series are stored in the memory 4 through a bus without any further processing.

Except in a consecutive photographing mode, when the picture data of the single frame have been stored in the memory 4, the microcomputer 1 executes a series of image processing steps, such as gamma corrections and a white balance adjustment, in accordance with an image processing program stored in a ROM or the like. Thereafter, the picture data having undergone such image processing are subjected to second image processing for data compression. Although not especially restricted, the resulting picture of compressed data is transferred to and stored in the memory 4 and the flash memory card 6 of the recording/reproducing unit by the DMAC. The recording/reproducing unit is provided with an input/output interface I/F, and this I/F includes a slot into which the flash memory card 6 is inserted for electrical connection.

In the video output unit, in correspondence with the display timings of the display device, picture data are iteratively read out of a frame memory 8, the picture data are converted into analog signals by the DA converter DAC according to this invention as described before, and the resulting luminance signals Y and chroma signals C and sync signals are synthesized by a composite video synthesis circuit 12, thereby to output composite video signals which conform to the NTSC system. Further, the video output unit includes an interface circuit I/F which receives the picture data read out of the frame memory 8, and the liquid crystal display LCD which operates to display the picture data passed through the I/F. The I/F accepts the picture data at a timing corresponding to the display operation of the LCD. In a case where the LCD presents a gradation display, the analog signals passed through the DAC are delivered to this LCD.

The digital still camera is fed with an operating voltage by a battery. In a battery-driven portable electronic apparatus, it is important to prolong the lifetime of the battery. According to the digital still camera of this embodiment, the lifetime of the battery can be sharply prolonged for the reasons that the CCD 3 is not driven at all times as stated before, and that power consumption is decreased owing to the installation of the DAC 11 permitted to operate with a low voltage. It is consequently possible to employ a small-sized battery of comparatively small power capacity, and to more promote making the size of a digital still camera small and the weight thereof light.

Figure 14:
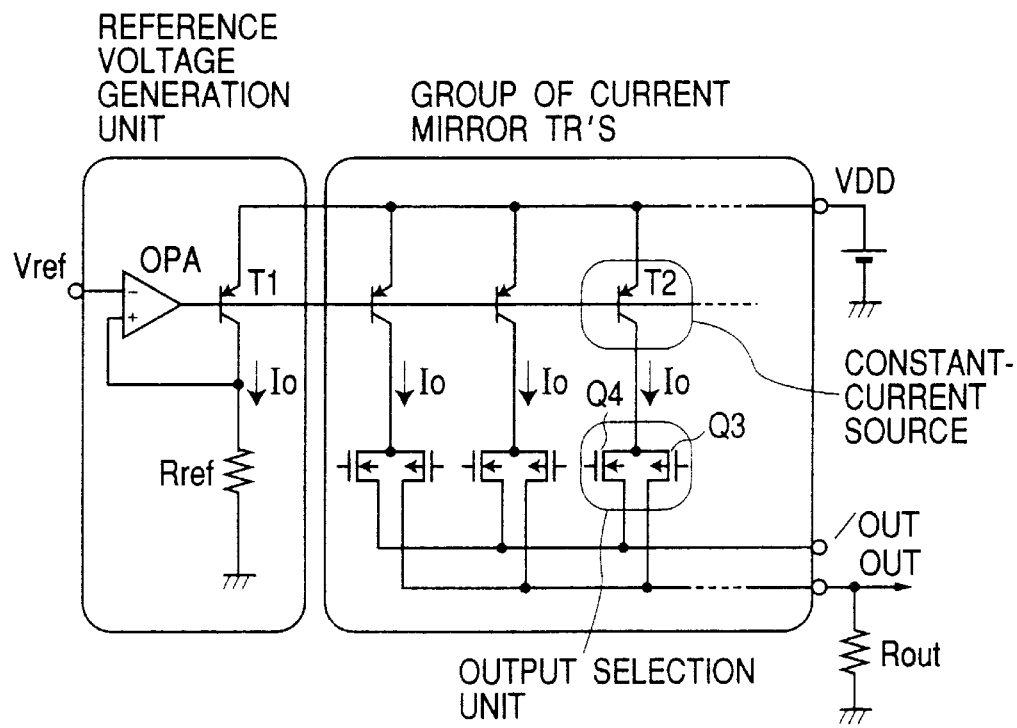
FIGS. 14A and 14B are diagrams for explaining another embodiment of the DA converter according to this invention.
Figure 14:
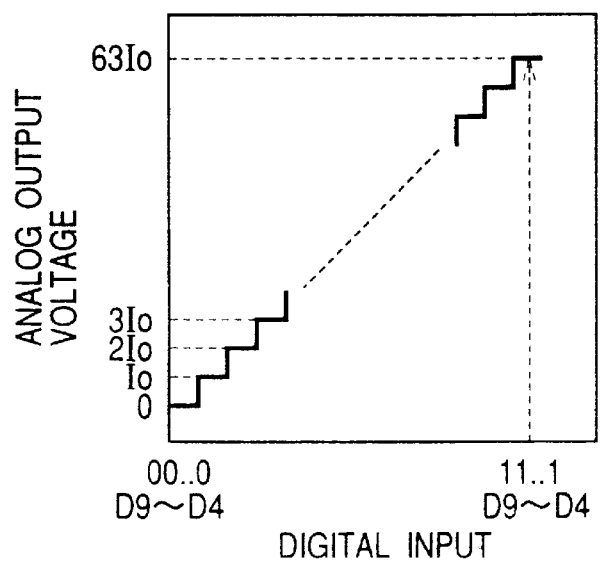

FIG. 14 is diagrams for explaining another embodiment of the DA converter according to this invention. Concretely, FIG. 14A illustrates an equivalent circuit for explaining the relationship between the group of constant-current cells 320 and the reference voltage generator circuit 400, while FIG. 14B illustrates the input-output characteristics of the equivalent circuit based on the group of constant-current cells 320.

Each of the 63 constant-current (Io) cells includes a PNP transistor T2 whose emitter is fed with the supply voltage VDD, whose base has a constant voltage applied thereto, the constant voltage being formed by a reference voltage generation unit to be explained later, and which constructs a constant-current source. A PNP transistor T1 is correspondingly employed as a current source transistor also in the reference voltage generation unit. That is, the bipolar transistor is employed as the element for forming the constant-current source in the foregoing embodiment. An output selection unit connected to the collector of the transistor T2 includes a switching MOSFET of P-channel type Q4 and a switching MOSFET of N-channel type Q4 which are easy of switching controls. The P-channel MOSFET Q3 has its source-drain path connected between the constant-current source MOSFET Q2 and the output terminal OUT, while the N-channel MOSFET Q4 has its source-drain path connected between the constant-current source MOSFET Q2 and the output terminal /OUT. Thus, the constant current Io formed by the constant-current source transistor T2 is fed to the output terminal OUT or /OUT through the corresponding one of the MOSFET's Q3 and Q4 which are complementarily controlled to turn ON and OFF by input signals (the selection signals stated before) as in the foregoing. The remaining 62 constant-current cells are constructed and operated similarly to the above. Besides, the constant-current transistors which correspond to the currents Io+a and Io+b in FIG. 1 and FIG. 9 are fabricated with their emitter areas correspondingly enlarged in order to compensate for the linearity error and full-scale error as stated before.

Functional effects attained by the foregoing embodiments are as follows:

(1) In a DA converter wherein an analog output voltage is formed in such a way that constant currents formed by a plurality of constant-current source transistors are selectively fed to a load resistor by controlling switching means to turn ON and OFF in correspondence with input signals; each of the constant-current source transistors is operated in an operating range from a saturation region to a non-saturation region as the output voltage enlarges in its absolute value, and those of the plurality of constant-current source transistors whose currents based on the operations in the non-saturation regions are selected by the switching means have their sizes (channel widths) enlarged so as to compensate for current decrements ascribable to such operations in the non-saturation regions; thereby to bring forth the effect that a linearity error and a full-scale error can be corrected while the DA converter is permitted to operate with a low voltage.

(2) In a DA converter wherein an analog output voltage is formed in such a way that constant currents formed by a plurality of constant-current source transistors are selectively fed to one end side of a load resistor by controlling switching means to turn ON and OFF in correspondence with input signals; a supply voltage is fed between a first terminal to which emitters or sources of the constant-current source transistors are connected and a second terminal to which the other end of the load resistor is connected, and it is set low so that a voltage obtained by subtracting a maximum value of the output voltage from the supply voltage may operate the constant-current source transistors in non-saturation regions; and those of the plurality of constant-current source transistors whose currents based on the operations in the non-saturation regions are selected by the switching means have their sizes (channel widths) enlarged so as to compensate for current decrements ascribable to such operations in the non-saturation regions; thereby to bring forth the effect that a linearity error and a full-scale error can be corrected while the DA converter is permitted to operate with a low voltage.

(3) The plurality of constant-current source transistors are classified into ones which have weights of currents corresponding to the binary digital signals on a lower bit side, and ones which have the same weight of currents in correspondence with digital signals obtained in such a way that the binary digital signals on a higher bit side are decoded in the decimal notation; and the constant-current source transistors on the higher bit side have their sizes (channel widths) enlarged so as to compensate for the current decrements ascribable to the operations in the non-saturation regions; thereby to bring forth the effect that a linearity error and a full-scale error can be corrected efficiently.

(4) As a constant voltage which is fed to bases or gates of the first and second constant-current transistors, there is employed an output voltage of a differential amplifier circuit which receives a reference voltage corresponding to a maximum value of the output voltage, and a voltage formed in such a way that a current formed by a transistor which is fabricated with the same size as that of ones of the constant-current transistors having the current weight correspondent to the higher bit side and whose emitter or source and base or gate are connected in common with those of the constant-current source transistors, is caused to flow through a reference resistor endowed with a resistance being that multiple of a resistance of the load resistor which corresponds to the number of the constant-current source transistors correspondent to the higher bit side; thereby to bring forth the effect that a full-scale error can be corrected at a high precision.

(5) Dummy switching means held in an ON state steadily is interposed between the transistor and the reference resistor in correspondence with the switching means disposed for the constant-current source transistors, thereby to bring forth the effects that the constant voltage matches better with groups of constant-current source cells, and that the full-scale error can be corrected at a still higher precision.

(6) Each of the switching means includes a pair of transistors which perform switching operations complementarily in response to the corresponding input signal, and one of which is connected to the load resistor, thereby to bring forth the effects that complementary output signals are obtained, and that the constant-current source transistors can be operated stably.

(7) The constant-current source transistors and the switching means are respectively fabricated of MOSFET'S, thereby to bring forth the effect that the DA converter is suited to one which is mounted in a digital integrated circuit constructed of MOSFET's.

(8) A DA converter comprises a current mirror circuit which produces an analog output voltage in such a way that constant currents formed by a plurality of constant-current source transistors are selectively fed to a load resistor by controlling switching means to turn ON and OFF in correspondence with input signals, and a reference voltage generation unit which forms a constant voltage for forming the constant currents; the plurality of constant-current source transistors include ones which have weights of currents corresponding to binary digital signals of lower bit side among the input signals, and ones which have the same weight of currents in correspondence with digital signals obtained in such a way that binary digital signals of higher bit side among the input signals are decoded in the decimal notation; and a voltage formed in such a way that a current formed by a transistor, which is fabricated with the same size as that of each of the constant-current source transistors having the current weight correspondent to the higher bit side and whose emitter (or source) and base (or gate) are respectively connected in common with those of the constant-current source transistors, is caused to flow through a resistance element endowed with a resistance being that multiple of a resistance of the load resistor which corresponds to the number of the constant-current source transistors correspondent to the higher bit side, and a reference voltage corresponding to a maximum output voltage to-be-set, are fed to the input ends of a differential amplifier circuit, whereby the currents to flow through the constant-current source transistors are controlled so as to equalize both the voltage across the resistance element and the reference voltage; thereby to bring forth the effect that a full scale error can be corrected at a high precision.

(9) Dummy transistors held in ON states are interposed between the transistor and the reference resistor in correspondence with the switching means, thereby to bring forth the effects that the constant voltage matches better with groups of constant-current source cells, and that the full-scale error can be corrected at a still higher precision.

Although this invention has been concretely described above on the basis of the embodiments, it is a matter of course that this invention is not restricted to the foregoing embodiments, but that it is variously alterable within a scope not departing from the purport thereof. By way of example, in FIG. 1 or FIG. 14A, the load resistor Rout and the reference resistor Rref which is provided in the reference voltage generator circuit may be similarly formed in the semiconductor integrated circuit, or they may well be constructed as components which are externally mounted. In the case of forming the resistors in the semiconductor integrated circuit, the resistance ratio can be set at a high precision, and hence, no problem is posed. The reference voltage Vref for setting the full-scale voltage may well be fed from an external terminal. In this case, it is permitted to set any desired full-scale voltage complying with an intended use.

This invention is extensively applicable to various electronic apparatuses as a da converter in which constant-current source MOSFET's or bipolar transistors can be operated over from saturation regions to non-saturation regions in relation to an output signal amplitude (full-scale voltage).

What is claimed is:

1. A DA converter comprising:
    a plurality of current source transistors; and
    switching means controlled to turn ON and OFF in correspondence with input signals, for selectively feeding currents to a load resistor which forms an analog output voltage, the currents being formed by said plurality of current source transistors;
    wherein each of said current source transistors is operated in an operating range from a saturation region to a non-saturation region as said analog output voltage enlarges in absolute value; and
    said plurality of current source transistors includes first current source transistors and second current source transistors, the second current source transistors having a larger size than the first current source transistors, such that output currents of the second current source transistors are greater than output currents of the first current source transistors for a given drain-source voltage corresponding to the analog output voltage, so that a current for compensating for a current decrement ascribable to operation thereof in the non-saturation region may be caused to flow in each of the second current source transistors.

2. A DA converter according to claim 1, wherein
    a first subset of said first current source transistors form current values corresponding to the binary input digital signals on a lower bit side; and
    said second current source transistors and a second subset of said first current source transistors form current values corresponding to digital signals obtained in such a way that the binary digital input signals on a higher bit side are decoded in the decimal notation.

3. A DA converter according to claim 2, wherein a voltage which is fed to bases or gates of the first and second current source transistors is set as an output voltage of a differential amplifier circuit which receives a reference voltage corresponding to a maximum value of said analog output voltage, and a current formed by a transistor which is fabricated with a size having the current value correspondent to that of the second current source transistors and whose emitter or source and base or gate are connected in common with those of said first and second current source transistors, is caused to flow through a reference resistor endowed with a resistance being that multiple of a resistance of said load resistor which corresponds to the sum of said second current source transistors and second subset of said first current source transistors.

4. A DA converter according to claim 3, wherein switching means held in an ON state steadily is interposed between said transistor and said reference resistor in correspondence with said switching means disposed for said current source transistors.

5. A DA converter according to claim 3, wherein each of said switching means includes a pair of transistors which perform switching operations complementarily in response to the corresponding input signal, and one of which is connected to said load resistor.

6. A DA converter according to claim 5, wherein said first and second current source transistors and said switching means are respectively fabricated of MOSFET's.

7. A DA converter according to claim 6, wherein the sizes of said plurality of current source transistors are channel widths thereof.

8. A DA converter comprising:
    a plurality of current source transistors; and
    switching means controlled to turn ON and OFF in correspondence with input signals, for selectively feeding currents to one end side of a load resistor which forms an analog output voltage, the currents being formed by said plurality of current source transistors;
    wherein a supply voltage is fed between a first terminal to which emitters or sources of said current source transistors are connected and a second terminal to which the other end of said load resistor is connected, and is set so that a voltage obtained by subtracting a maximum value of the analog output voltage from such a supply voltage may operate said current source transistors in non-saturation regions; and
    said plurality of current source transistors includes first current source transistors and second current source transistors, the second current source transistors having a larger size than the first current source transistors, such that output currents of the second current source transistors are greater than output currents of the first current source transistors for a given drain-source voltage corresponding to the analog output voltage, so as to compensate for current decrements ascribable to said operations in said non-saturation regions.

9. A DA converter according to claim 8, wherein
    a first subset of said first current source transistors form current values corresponding to the binary input digital signals on a lower bit side; and
    said second current source transistors and a second subset of said first current source transistors form current values corresponding to digital signals obtained in such a way that the binary digital input signals on a higher bit side are decoded in the decimal notation.

10. A DA converter according to claim 9, wherein a voltage which is fed to bases or gates of the first and second current source transistors is set as an output voltage of a differential amplifier circuit which receives a reference voltage corresponding to a maximum value of said analog output voltage, and a current formed by a transistor which is fabricated with a size having the current value correspondent to that of the second current source transistors and whose emitter or source and base or gate are connected in common with those of said first and second current source transistors, is caused to flow through a reference resistor endowed with a resistance being that multiple of a resistance of said load resistor which corresponds to the sum of said second current source transistors and second subset of said first current source transistors.

11. A DA converter according to claim 10, wherein switching means held in an ON state steadily is interposed between said transistor and said reference resistor in correspondence with said switching means disposed for said current source transistors.

12. A DA converter according to claim 10, wherein each of said switching means includes a pair of transistors which perform switching operations complementarily in response to the corresponding input signal, and one of which is connected to said load resistor.

13. A DA converter according to claim 12, wherein said first and second current source transistors and said switching means are respectively fabricated of MOSFET's.

14. A DA converter according to claim 13, wherein the sizes of said plurality of current source transistors are channel widths thereof.

15. A DA converter comprising:
   a current mirror circuit which includes a plurality of current source transistors, and switching means controlled to turn ON and OFF in correspondence with input signals, for selectively feeding currents to a load resistor which forms an analog output voltage, the currents being formed by said plurality of current source transistors; and
   a reference voltage generation unit;
   wherein said plurality of current source transistors of said current mirror circuit include:
      first current source transistors which have current values corresponding to the binary digital signals of the input signals on a lower bit side; and
      second current source transistors which are fabricated so as to have current values corresponding to digital signals obtained in such a way that the binary digital signals of said input signals on a higher bit side are decoded in the decimal notation; and
   said reference voltage generation unit includes:
      a transistor which is fabricated with a size having the current value correspondent to that of the second current source transistors, and whose emitter or source and base or gate are connected in common with those of the first and second current source transistors;
      a reference resistor which is fed with a current formed by said transistor, and which is endowed with a resistance being a multiple of a resistance of said load resistor, the multiple corresponding to the number of said second current source transistors; and
      a differential amplifier circuit which receives a voltage formed by said reference resistor, and a reference voltage corresponding to a maximum output analog voltage to-be-set, and which forms a voltage that is fed to the bases or gates of said first and second current source transistors.

16. A DA converter according to claim 15, wherein transistors held in ON states are interposed between said transistor and said reference resistor in correspondence with said switching means.

17. A DA converter according to claim 15, wherein said plurality of current source transistors are MOSFET's, and the sizes of such plurality of current source transistors are channel widths thereof.

* * * * *